United States Patent
Takeguchi et al.

(10) Patent No.: US 8,469,614 B2
(45) Date of Patent: Jun. 25, 2013

(54) SUBSTRATE TREATMENT METHOD, COMPUTER STORAGE MEDIUM AND SUBSTRATE TREATMENT APPARATUS

(75) Inventors: Hirofumi Takeguchi, Koshi (JP); Yuichi Yoshida, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 10 days.

(21) Appl. No.: 13/280,409

(22) Filed: Oct. 25, 2011

(65) Prior Publication Data

US 2012/0115090 A1    May 10, 2012

(30) Foreign Application Priority Data

Nov. 9, 2010  (JP) ................................. 2010-251032

(51) Int. Cl.
*G03D 5/00*        (2006.01)
(52) U.S. Cl.
USPC .......................................... 396/582; 396/611
(58) Field of Classification Search
USPC ................................................ 396/582, 611
See application file for complete search history.

(56) References Cited

U.S. PATENT DOCUMENTS

| 7,665,916 | B2* | 2/2010 | Yamamoto et al. | 396/611 |
| 8,147,153 | B2* | 4/2012 | Takeguchi et al. | 396/604 |
| 2009/0074402 | A1* | 3/2009 | Miyagi et al. | 396/611 |
| 2009/0311632 | A1* | 12/2009 | Takeguchi et al. | 430/322 |
| 2012/0115090 | A1* | 5/2012 | Takeguchi et al. | 430/435 |

FOREIGN PATENT DOCUMENTS

| JP | A-2004-072061 | 3/2004 |
| JP | A-2009-33053 | 2/2009 |

* cited by examiner

*Primary Examiner* — W B Perkey
(74) *Attorney, Agent, or Firm* — Posz Law Group, PLC (57) ABSTRACT

The present disclosure is a substrate treatment method of supplying a surface treatment liquid onto a surface of a substrate having a film with high water repellency formed thereon, the method including: a liquid puddle forming step of forming a liquid puddle of the surface treatment liquid by supplying the surface treatment liquid from a nozzle to one location of a peripheral portion of the substrate; and a liquid puddle moving step of then moving the liquid puddle formed at the peripheral portion of the substrate to a central portion of the substrate by moving the nozzle from a position above the peripheral portion of the substrate to a position above the central portion of the substrate while continuing the supply of the surface treatment liquid.

13 Claims, 9 Drawing Sheets

| | | \multicolumn{8}{c}{PURE WATER SUPPLY START POSITION (DISTANCE X FROM CENTRAL PORTION OF WAFER W) (mm)} |
|---|---|---|---|---|---|---|---|---|---|
| | | 0 | 20 | 40 | 60 | 80 | 100 | 120 | 140 |
| PURE WATER NOZZLE 40 MOVING SPEED (mm/sec) | 50 | | | | | | △ | | |
| | 100 | | | | | | | | |
| | 150 | | | | ▽ | △ | △ | △ | |
| | 200 | | | | ▽ | ○ | ○ | △ | |
| | 250 | | | | ▽ | ○ | ○ | ○ | △ | △ |
| | 300 | | | | ▽ | ○ | ○ | ○ | | |
| | 500 | | | | ▽ | ○ | ○ | ○ | | |
| | 1000 | | | | ▽ | ○ | ○ | ○ | △ | △ |

FIG.15

LIQUID PUDDLE Pa
PASSED PORTION

FIG. 16

DEVELOPMENT DEFECTS AT CENTRAL PORTION

FIG. 17

SUBSTRATE TREATMENT METHOD, COMPUTER STORAGE MEDIUM AND SUBSTRATE TREATMENT APPARATUS

BACKGROUND OF THE INVENTION

1. Field of the Invention

The present invention relates to a method of treating a substrate having a film with high water repellency formed thereon, a computer storage medium and a substrate treatment apparatus.

2. Description of the Related Art

For example, in a photolithography process in manufacturing processes of a semiconductor device, for example, resist coating treatment for forming a resist film by applying a resist solution onto a semiconductor wafer (hereinafter, referred to as a "wafer"), exposure processing for exposing the resist film to a predetermined pattern, developing treatment for developing the exposed resist film and so on are sequentially performed, whereby a predetermined resist pattern is formed on the wafer.

Regarding the above-described developing treatment of the resist film, there is a widely known method of supplying a developing solution from a nozzle to the central portion of the wafer while the wafer after the exposure processing is being rotated to thereby spread the developing solution over the wafer by the centrifugal force to develop the resist film on the wafer. For performing such a developing treatment, it is necessary to spread the developing solution so that the developing solution extends over the entire surface of the wafer.

Incidentally, a material with high water repellency is sometimes used as the material of resist. In the case of using the resist material with high water repellency, the developing solution does not extend over the entire wafer surface when rotating the wafer because the developing solution is low in wettability with respect to a resist film, thereby often causing development defects such as poor resolution and opening failure at locations where development is not normally performed.

Therefore, for example, Patent Document 1 suggests a developing treatment method of executing the following first to third steps as a method of reducing the development defects when the resist with high water repellency is used. Namely, pure water as a surface treatment liquid is supplied to a central portion of the wafer to enhance the wettability of the developing solution with respect to the resist film in the first step, and then the wafer is rotated around the vertical axis to form a liquid film of the pure water on the wafer surface. Subsequently, in the second step, the developing solution is supplied to the central portion of the wafer while the wafer is being rotated after the liquid film is formed. In this second step, the developing solution extends also to the location to which the surface treatment liquid has not sufficiently extended, because the wafer surface is likely to get wet due to the pure water. By the first step and the second step, a so-called pre-wet treatment of wetting in advance the entire wafer surface with the pure water and the developing solution is performed to improve the wettability of the developing solution supplied to the wafer surface during the development. Thereafter, the developing solution is supplied to the wafer while the wafer is being rotated in the third step, whereby the supplied developing solution spreads while wetting the top of the developing solution supplied in the second step to thereby develop the resist.

Patent Document 1: Japanese Laid-open Patent Publication No. 2009-33053

SUMMARY OF THE INVENTION

Figure 16:
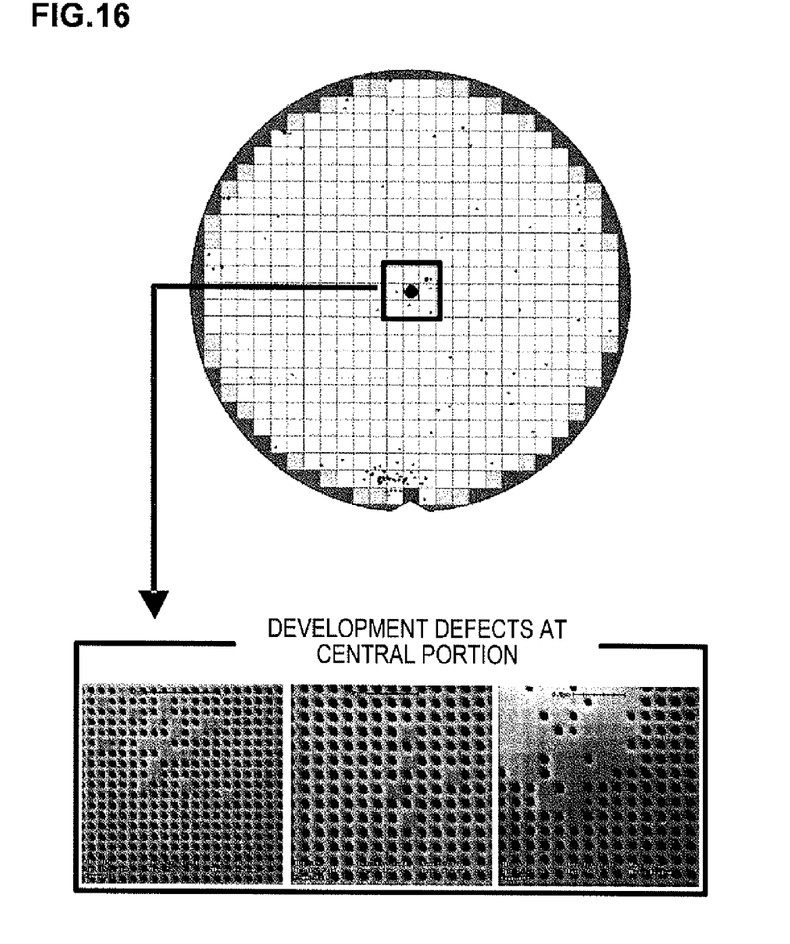
FIG. 16 is an explanatory view illustrating the appearance that development defects occurred at the central portion of the wafer.

However, even when using the method of the above-described Patent Document 1, development defects still occurred depending on the kind of the applied resist. The present inventors investigated this point and confirmed that the development defects occurred mainly at the central portion of the wafer as illustrated in FIG. 16.

Figure 17:
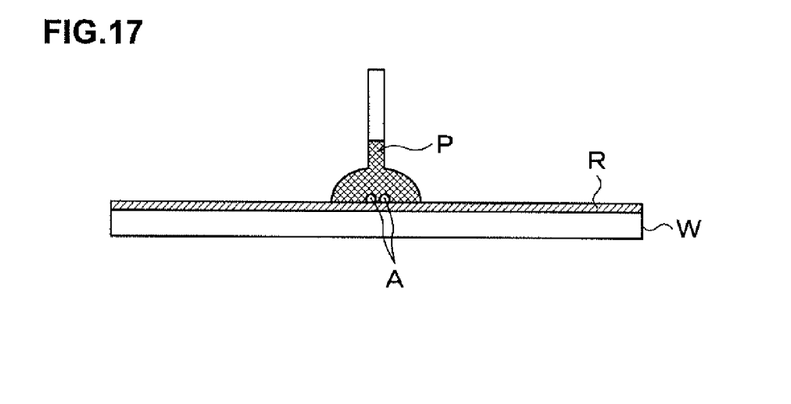
FIG. 17 is an explanatory view schematically illustrating the state that air bubbles occurred between the resist film and the pure water on the wafer.

Since the development defects occurred at the central portion of the wafer, the present inventors inferred that the development defects occurred because small air bubbles A were formed between the wafer W and pure water P, for example, as illustrated in FIG. 17 at the position where the pure water supplied from a nozzle landed on the wafer and the air bubbles inhibited the contact between a resist film R and a developing solution supplied in the subsequent step.

The present invention has been made in consideration of the above points, and it object is to reduce defects on a substrate surface by removing air bubbles occurring between the substrate and a surface treatment liquid when the surface treatment liquid is supplied onto the substrate.

To achieve the above object, the present invention is a substrate treatment method of supplying a surface treatment liquid onto a surface of a substrate having a film with high water repellency formed thereon, the method including: a liquid puddle forming step of forming a liquid puddle of the surface treatment liquid by supplying the surface treatment liquid from a nozzle to one location of a peripheral portion of the substrate; and a liquid puddle moving step of then moving the liquid puddle formed at the peripheral portion of the substrate to a central portion of the substrate by moving the nozzle from a position above the peripheral portion of the substrate to a position above the central portion of the substrate while continuing the supply of the surface treatment liquid.

According to the present invention, when the surface treatment liquid is first supplied to one location of the peripheral portion of the substrate, a liquid puddle is formed at a position where the supplied surface treatment liquid lands on the substrate, and small air bubbles occur between the liquid puddle and the substrate. Then, by moving the nozzle to a position above the central portion of the substrate while continuing the supply of the surface treatment liquid, the liquid puddle formed at the peripheral portion of the substrate is moved to the central portion of the substrate, so that the air bubbles existing between the substrate and the surface treatment liquid can be exposed to the outside and removed. Therefore, according to the present invention, the air bubbles occurring between the substrate and the surface treatment liquid when the surface treatment liquid is supplied onto the substrate never inhibit the contact between, for example, the resist film and the developing solution. Therefore, defects on the substrate surface can be reduced.

The present invention according to another aspect is a non-transitory computer-readable storage medium storing a program running on a computer of a control unit controlling a substrate treatment apparatus to cause the substrate treatment apparatus to execute the substrate treatment method.

The present invention according to still another aspect is a substrate treatment apparatus for supplying a surface treatment liquid onto a surface of a substrate having a film with high water repellency formed thereon, the apparatus including: a nozzle supplying the surface treatment liquid onto the substrate; a nozzle moving mechanism moving the nozzle;

and a control unit controlling operations of the nozzle and the nozzle moving mechanism, wherein the control unit controls the nozzle and the nozzle moving mechanism to form a liquid puddle of the surface treatment liquid by supplying the surface treatment liquid from the nozzle to one location of a peripheral portion of the substrate and then move the liquid puddle formed at the peripheral portion of the substrate to a central portion of the substrate by moving the nozzle from a position above the peripheral portion of the substrate to a position above the central portion of the substrate while continuing the supply of the surface treatment liquid.

DETAILED DESCRIPTION OF THE INVENTION

Figure 1:
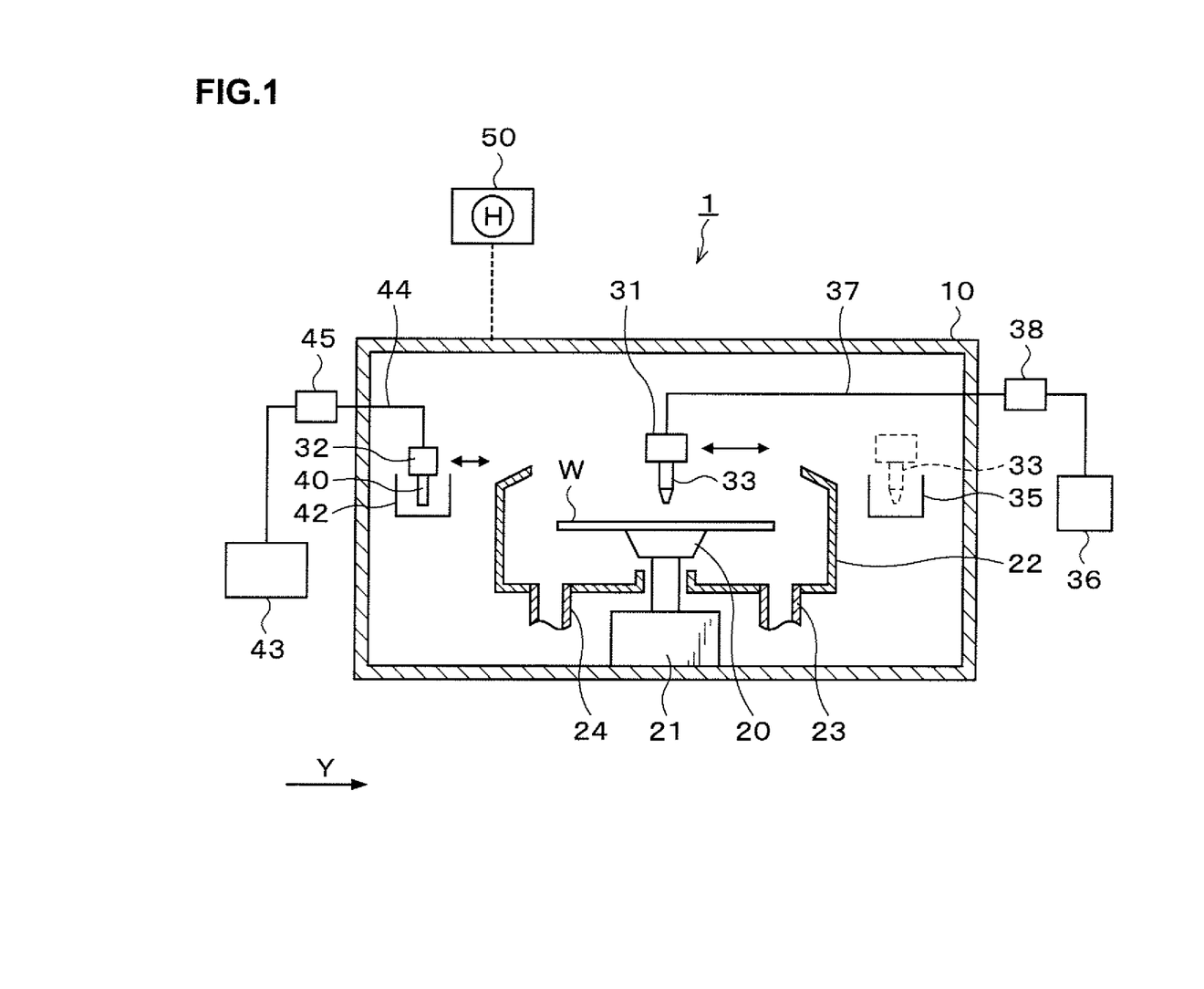
FIG. 1 is a longitudinal sectional view illustrating the outline of the configuration of a developing treatment apparatus according to this embodiment.
Figure 2:
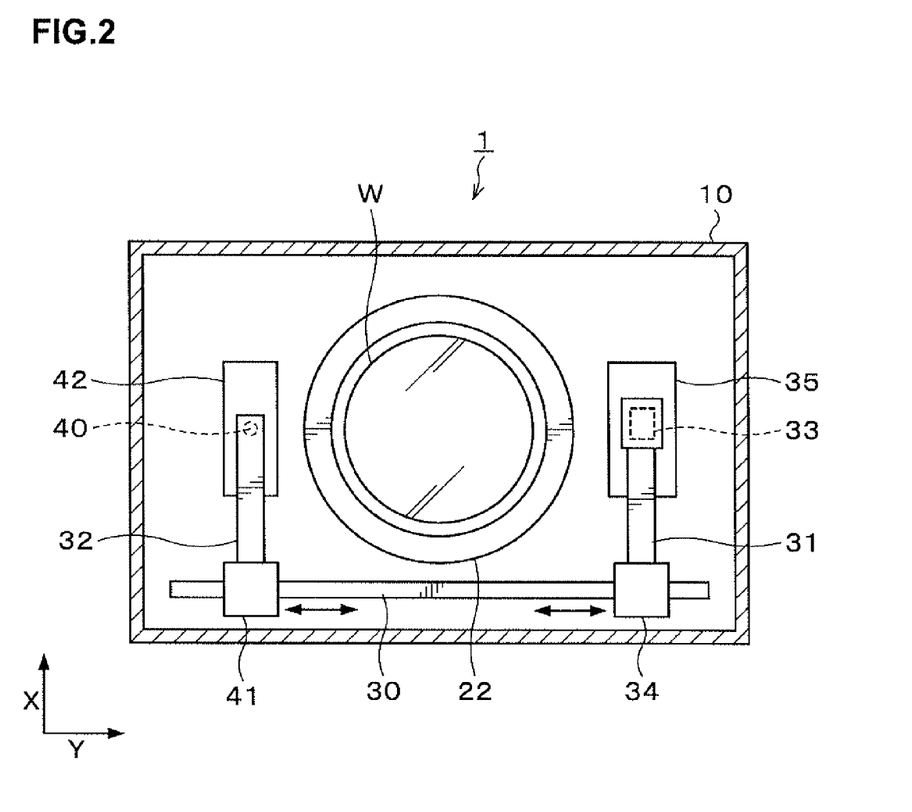
FIG. 2 is a transverse sectional view illustrating the outline of the configuration of the developing treatment apparatus according to this embodiment.

Hereinafter, an embodiment of the present invention will be described. FIG. 1 is a longitudinal sectional view illustrating the outline of the configuration of a developing treatment apparatus 1 as a substrate treatment apparatus according to this embodiment. FIG. 2 is a transverse sectional view illustrating the outline of the configuration of the developing treatment apparatus 1. Note that the diameter of the wafer W used as the substrate in this embodiment is 300 mm.

The developing treatment apparatus 1 has a treatment container 10 as illustrated in FIG. 1. At the central part in the treatment container 10, a spin chuck 20 as a rotating and holding unit is provided which holds and rotates the wafer W thereon. The spin chuck 20 has a horizontal upper surface which is provided with, for example, a suction port (not illustrated) for sucking the wafer W. Suction through the suction port enables the wafer W to be suction-held on the spin chuck 20.

The spin chuck 20 has a chuck drive mechanism 21 including, for example, a motor, and can rotate at a predetermined speed by means of the chuck drive mechanism 21. Further, the chuck drive mechanism 21 is provided with a raising and lowering drive source such as a cylinder so that the spin chuck 20 can move up and down.

Around the spin chuck 20, a cup 22 is provided which receives and collects liquid splashing or dropping from the wafer W. A drain pipe 23 for draining the collected liquid and an exhaust pipe 24 for exhausting the atmosphere in the cup 22 are connected to the bottom surface of the cup 22.

As illustrated in FIG. 2, on an X-direction negative direction (a downward direction in FIG. 2) side of the cup 22, a rail 30 is formed which extends in a Y-direction (a right-left direction in FIG. 2). The rail 30 is formed, for example, from a Y-direction negative direction (a left direction in FIG. 2) side outer position of the cup 22 to a Y-direction positive direction (a right direction in FIG. 2) side outer position. To the rail 30, for example, two arms 31, 32 are attached.

Figure 3:
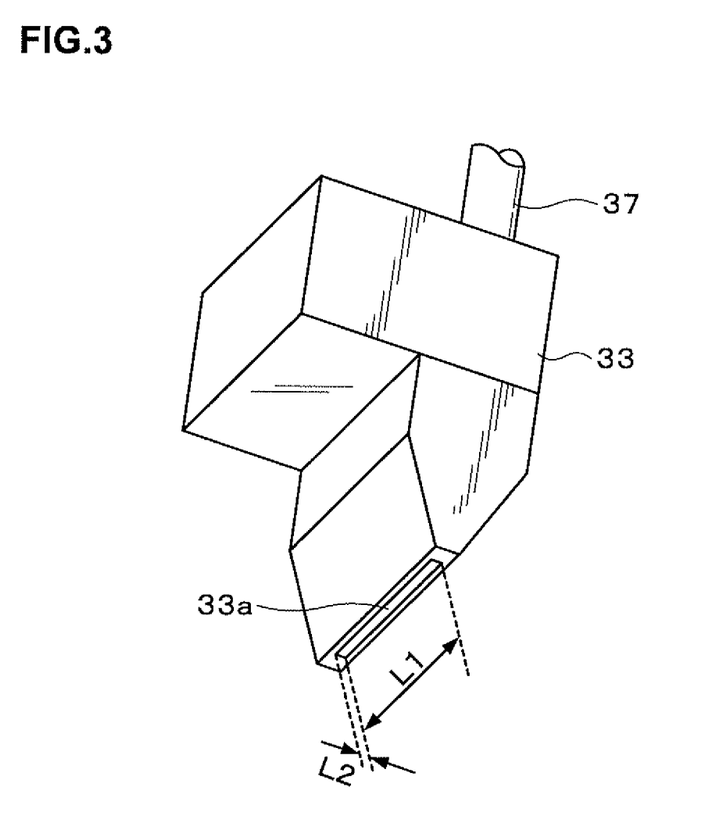
FIG. 3 is a perspective view of a developing solution nozzle.

On the first arm 31, a developing solution nozzle 33 for supplying a developing solution to the wafer W is supported as illustrated in FIG. 1 and FIG. 2. The developing solution nozzle 33 has a band-shape discharge port 33a with a length L of 8 to 15 mm and a width L2 of 0.1 to 1 mm provided at its lower end surface, for example, as illustrated in FIG. 3.

The first arm 31 is movable on the rail 30 by means of a nozzle drive unit 34 illustrated in FIG. 2. This allows the developing solution nozzle 33 to move from a waiting section 35 provided at a Y-direction positive direction side outer position of the cup 22 to a position above a central portion of the wafer W in the cup 22 and further move in a direction of the diameter of the wafer W above the surface of the wafer W. Further, the first arm 31 can freely move up and down by means of the nozzle drive unit 34 to be able to adjust the height of the developing solution nozzle 33.

To the developing solution nozzle 33, a supply pipe 37 communicating with a developing solution supply source 36 is connected as illustrated in FIG. 1. In the developing solution supply source 36, a developing solution is stored. The supply pipe 37 is provided with a supply equipment group 38 including a valve, a flow regulator and so on for controlling the flow of the developing solution.

On the second arm 32, a pure water nozzle 40 for supplying pure water as a surface treatment liquid is supported. The second arm 32 is movable on the rail 30 by means of a nozzle drive unit 41 as a nozzle moving mechanism illustrated in FIG. 2 and can move the pure water nozzle 40 from a waiting section 42 provided at a Y-direction negative direction side outer position of the cup 22 to a position above the central portion of the wafer W in the cup 22. Further, the second arm 32 can freely move up and down by means of the nozzle drive unit 41 to be able to adjust the height of the pure water nozzle 40.

To the pure water nozzle 40, a supply pipe 44 communicating with a pure water supply source 43 is connected as illustrated in FIG. 1. In the pure water supply source 43, pure water is stored. The supply pipe 44 is provided with a supply equipment group 45 including a valve, a flow regulator and so on for controlling the flow of the pure water. Note that the developing solution nozzle 33 supplying the developing solution and the pure water nozzle 40 supplying the pure water are supported on the separate arms in the above configuration, but may be individually supported on the same arm so that the movements and the supply timings of the developing solution nozzle 33 and the pure water nozzle 40 may be controlled by controlling the movement of the arm.

The above-described operations of the driving system such as the rotational operation and the up/down operation of the spin chuck 20, the moving operation of the developing solution nozzle 33 by the nozzle drive unit 34, the supply operation of the developing solution of the developing solution nozzle 33 by the supply equipment group 38, the moving operation of the pure water nozzle 40 by the nozzle drive unit 41, the supply operation of the pure water of the pure water nozzle 40 by the supply equipment group 45 and so on are controlled by the control unit 50. The control unit 50 is composed of a computer equipped with, for example, a CPU and a memory, and can realize the developing treatment in the developing treatment apparatus 1 by executing programs, for example, stored in the memory. Note that various programs used for implementing the developing treatment in the developing treatment apparatus 1 are ones that are stored, for example, in a storage medium H such as a computer-readable hard disk (HD), flexible disk (FD), compact disk (CD), magneto-optical disk (MO), or a memory card and installed from the storage medium H into the control unit 50.

Figure 4:
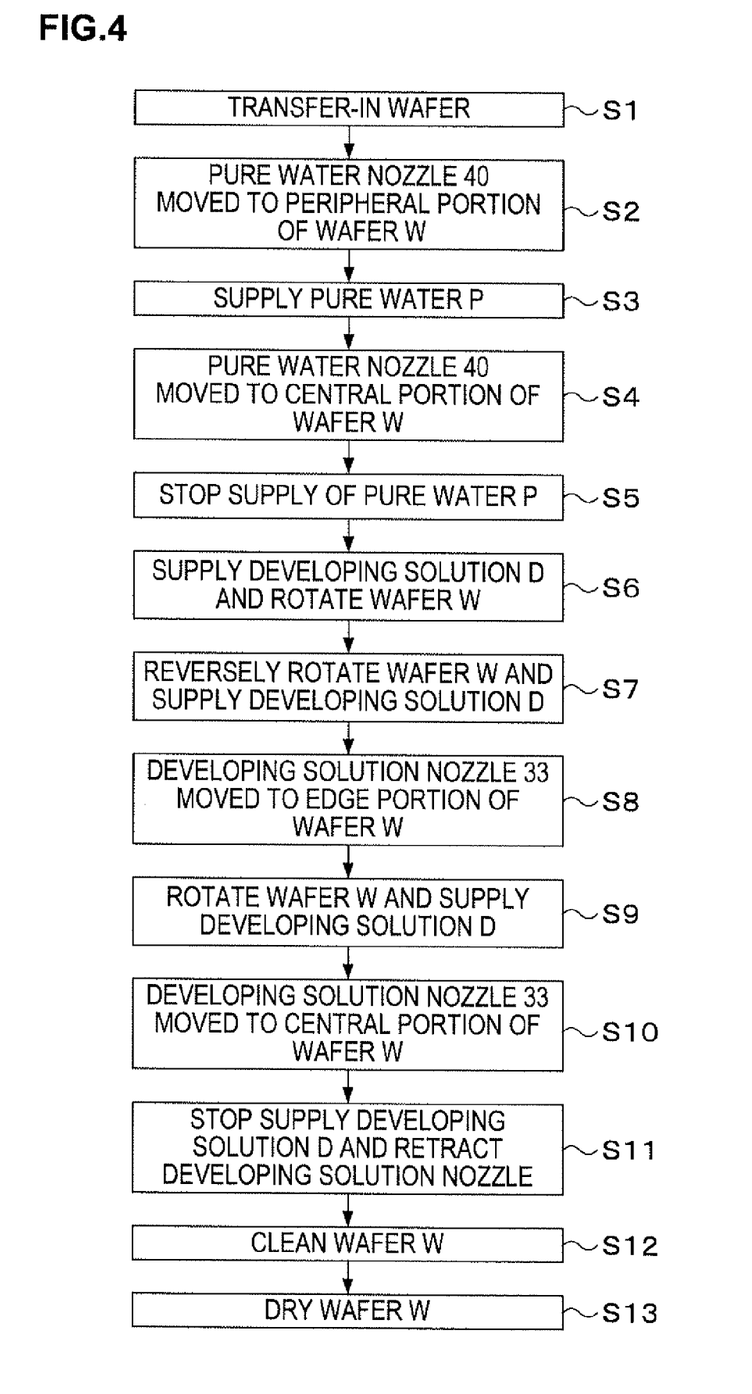
FIG. 4 is a flowchart illustrating main steps of developing treatment.

Next, a developing treatment process performed in the developing treatment apparatus 1 configured as described above will be described. FIG. 4 is a flowchart illustrating an example of main steps of the developing treatment.

For performing the developing treatment, a wafer W is first transferred by a not-illustrated transfer mechanism into the treatment container 10 of the developing treatment apparatus 1 (Step S1 in FIG. 4). The wafer W transferred in the developing treatment apparatus 1 is first suction-held on the spin chuck 20. On the wafer W transferred into the treatment container 10, a water-repellent resist film has been formed in advance and has been subjected to exposure processing. As the resist film formed on the wafer W, a resist film having a contact angle on the surface of the resist film is, for example, 85 degrees or more is used. Further, the wettability of the developing solution used for development of the resist film with respect to the pure water is greater than the wettability thereof with respect to the resist film.

Subsequently, a so-called pre-wet treatment is performed prior to the developing treatment. The pre-wet treatment is the treatment for reducing the contact angle when the developing solution is supplied to the surface of the wafer W so as to make the developing solution easily spread. Concretely, the pre-wet treatment refers to supply of a solution excellent in wettability with respect to the developing solution, prior to the supply of the developing solution, in the case that the resist film formed on the surface of the wafer W has high water repellency so that when the developing solution is supplied in the developing treatment, the developing solution is difficult to spread over the entire surface of the wafer W.

For performing the pre-wet treatment, the pure water nozzle 40 at the waiting section 42 is first moved by the second arm 32 to a position above a peripheral portion of the wafer W (Step S2 in FIG. 4). Note that the peripheral portion of the wafer W refers to a position separated from the center of the wafer, for example, by a distance X.

Figure 5:
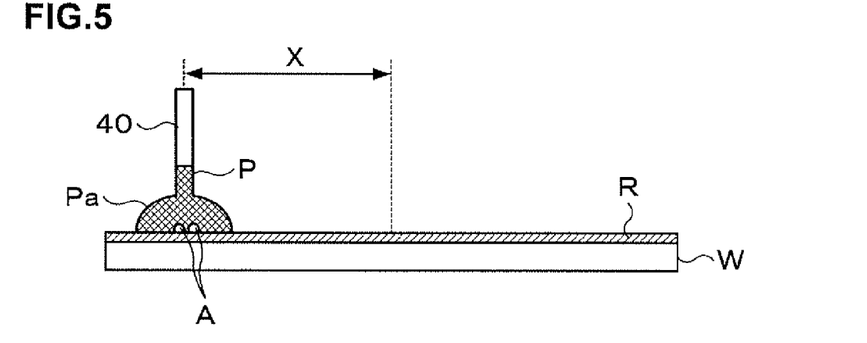
FIG. 5 is an explanatory view schematically illustrating the state that pure water is supplied to a peripheral portion of the wafer.

Next, with the wafer W being at a standstill, pure water is supplied at a flow rate of 100 to 1000 ml/min from the pure water nozzle 40 to the peripheral portion of the wafer W, for example, 400 ml/min in this embodiment (Step S3 in FIG. 4). The supply of the pure water is performed with the pure water nozzle 40 standing still at a predetermined position of the peripheral portion of the wafer W. Note that the distance in the height direction between the wafer W and the pure water nozzle 40 when the pure water is supplied from the pure water nozzle 40 is set, for example, at 1 to 30 mm. By supplying the pure water with the pure water nozzle 40 and the wafer W being standing still, the pure water is supplied to one location of the peripheral portion of the wafer W. This forms a liquid puddle Pa of pure water P at the peripheral portion of the wafer W as illustrated in FIG. 5. In this event, small air bubbles A occur between the liquid puddle Pa of the supplied pure water P and the resist film R, at a position where the pure water P supplied to the wafer W lands, namely, at a position vertically below the pure water nozzle 40 on the wafer W as illustrated in FIG. 5.

Figure 6:
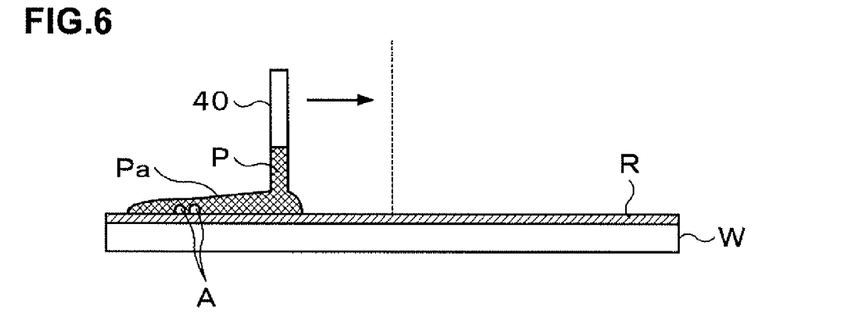
FIG. 6 is an explanatory view schematically illustrating the state that a pure water nozzle is moved toward a position above the central portion of the wafer while supplying pure water to the wafer.
Figure 7:
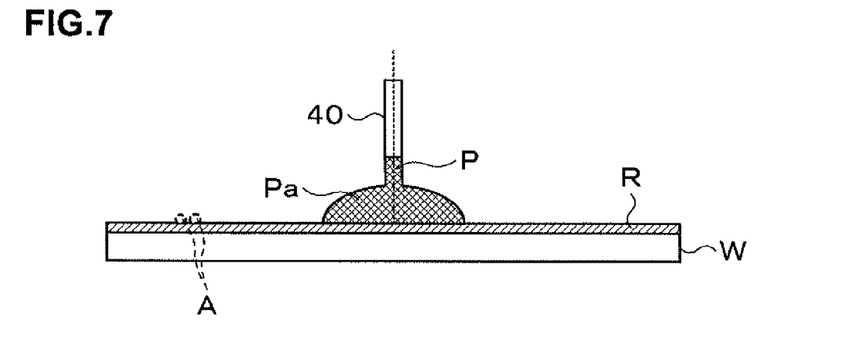
FIG. 7 is an explanatory view schematically illustrating the state that a liquid puddle of pure water has been moved to the central portion of the wafer.
Figure 8:
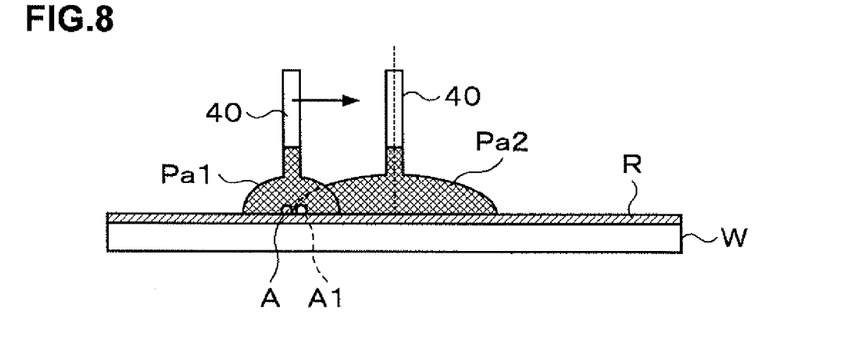
FIG. 8 is an explanatory view schematically illustrating the state that a liquid puddle of pure water has been formed on the wafer.

Subsequent to the step of forming the liquid puddle, the pure water nozzle 40 is moved at a moving speed, for example, of 250 mm/sec toward a position corresponding to the central portion of the wafer W as illustrated in FIG. 6 with the pure water P continued to be supplied from the pure water nozzle 40 (Step S4 in FIG. 4). In this event, the liquid puddle Pa of the pure water P formed at the peripheral portion of the wafer W is moved toward the central portion of the wafer W accompanying the movement of the pure water P supplied from the pure water nozzle 40 by the surface tension of the pure water P. As a result, as illustrated in FIG. 7, the liquid puddle Pa formed at the peripheral portion of the wafer W moves to the central portion of the wafer W. Though the liquid puddle Pa moves with the movement of the pure water nozzle 40, the air bubbles A occurred between the liquid puddle Pa and the resist film R do not move but stay at the location as illustrated in FIG. 6. As a result, the air bubbles A at the peripheral portion of the wafer W disappear accompanying the movement of the liquid puddle Pa, and a liquid puddle Pa without air bubbles A is formed at the central portion of the wafer W. Note that to remove all of the air bubbles A existing between the liquid puddle Pa and the resist film R by moving the liquid puddle Pa as described above, it is necessary to start the supply of the pure water P from the pure water nozzle 40, at an appropriate position at the peripheral portion of the wafer W. Concretely, the liquid puddle Pa formed at the peripheral portion of the wafer W illustrated in FIG. 5 is preferably formed at a position where it does not interfere, in a plan view, with the liquid puddle Pa after moved to the central portion of the wafer W illustrated in FIG. 7. This is because, for example, if a liquid puddle Pa1 formed at the peripheral portion of the wafer W interferes with a liquid puddle Pa2 after moved to the central portion of the wafer W as illustrated in FIG. 8, an air bubble A1 located in an interference area is not exposed to the outside of the liquid puddle Pa1 but stays therein, so that the air bubble A1 in the area cannot be removed even by the movement of the liquid puddle Pa1. Note that the interference here does not mean the actual interference between the liquid puddle Pa1 and the liquid puddle Pa2, but means that at least a part of the area where the liquid puddle Pa1 has been formed and a part of the area where the liquid puddle Pa2 is formed overlap each other in a plan view, not including, for example, the case that end portions of the areas are in abutment with each other.

Then, after the pure water nozzle 40 is moved to the position above the central portion of the wafer W in the step of moving the above-described liquid puddle Pa, the supply of the pure water from the pure water nozzle 40 is then stopped (Step S5 in FIG. 4). Note that the moving speed when the pure water nozzle 40 is moved in Step S4 is not limited to 250 mm/sec as described above but may be arbitrarily set based on the correlation with the position where the supply of the pure water P is started at the peripheral portion of the wafer W. By the present inventors, it has been confirmed in a test that it is possible to preferably remove the air bubbles A when the position where the pure water nozzle 40 starts the supply of the pure water P at the peripheral portion of the wafer W is a position at a distance X from the central portion of the wafer W ranging 60 mm to 100 mm when the moving speed of the pure water nozzle 40 is set to a range from 250 mm/sec to 1000 mm/sec, and when the position where the pure water nozzle 40 starts the supply of the pure water P at the peripheral portion of the wafer W is a position at a distance X from the central portion of the wafer W ranging 60 mm to 80 mm when the moving speed of the pure water nozzle 40 is set to a range from 200 mm/sec to less than 250 mm/sec. An example of this test will be described later.

Figure 9:
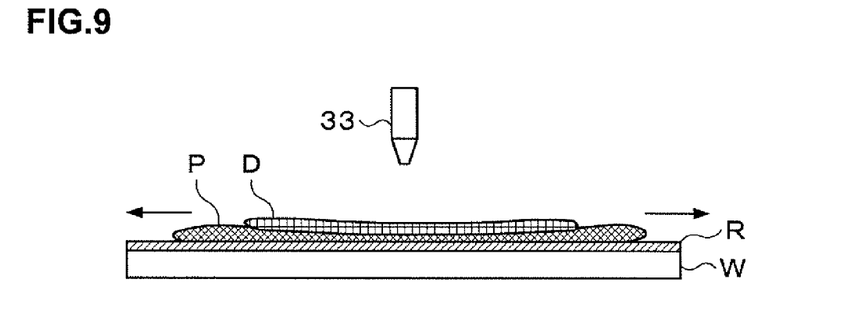
FIG. 9 is an explanatory view schematically illustrating the appearance that pure water and a developing solution spread toward an edge portion of the wafer.

Next, the pure water nozzle 40 is moved from the position above the central portion of the wafer W to the waiting section 42 and kept waiting, and then the developing solution nozzle 33 is moved to a position above the central portion of the wafer W. Subsequently, the developing solution nozzle 33 discharges the developing solution to the central portion of the wafer W, for example, for one second, and the wafer W is rotated, for example, counterclockwise, and the number of rotations is increased up to 1500 rpm (Step S6 in FIG. 4). The timing to increase the number of rotations is, for example, immediately after the developing solution supplied from the developing solution nozzle 33 reaches the wafer W. Then, the wafer W is rotated, whereby the liquid puddle Pa at the central portion of the wafer W tries to spread toward the edge portion of the wafer W. In this event, since the resist film R with high water repellency has been formed on the surface of the wafer W, the surface of the wafer W has high water repellency with respect to the pure water P. However, a certain amount of pure water P has been secured in advance at the central portion of the wafer W due to the liquid puddle Pa, so that the pure water P tries to evenly spread on the surface of the wafer W. Then, as illustrated, for example, in FIG. 9, the developing solution D supplied from the developing solution nozzle 33 spreads toward the edge portion of the wafer W together with the liquid puddle Pa of the pure water P or spreads on the upper surface of the spread pure water P and thereby evenly spreads within the wafer W. In this case, the pure water P serves as the surface treatment liquid for evenly spreading the developing solution D within the wafer W.

After the developing solution D is spread over the surface of the wafer W by rotating the wafer W, the wafer W is reversely rotated. In this embodiment, for example, the rotation direction of the wafer W is switched from the counterclockwise direction to the clockwise direction, and the wafer W is rotated at a rotation number of 1500 rpm. Along with that, the developing solution D is supplied again from the developing solution nozzle 33 for one second and spreads toward the edge portion of the wafer W (Step S7 in FIG. 4). With this Step S7, the pre-wet treatment ends. Spreading the developing solution D over the entire surface of the wafer W improves the wettability of the developing solution D, which is supplied in the step of subsequently performed developing treatment, with respect to the wafer W. Note that the reason why the rotation direction of the wafer W is reversed when the developing solution D is supplied to the central portion of the wafer W in Step S7 is to prevent a dissolved material, which elutes from an exposed region of the resist film R when the developing solution D comes into contact with the exposed region, from adhering unevenly to a part of the surface of the wafer W.

Figure 10:
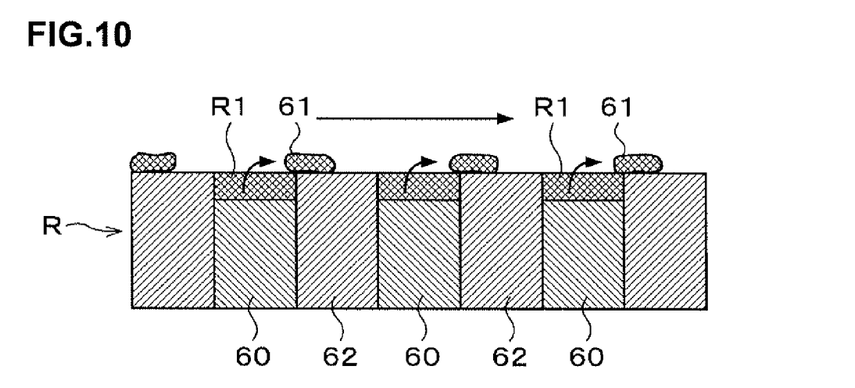
FIG. 10 is an explanatory view schematically illustrating the appearance that a dissolved material of resist dissolved with the developing solution elutes from the resist film.

Discussing this point in detail, the dissolved material from the resist film R generally elutes more from the exposed region of the resist film R as the pH of the solution in contact with the resist film R approaches 7 by the cleaning treatment after the developing treatment. The present inventors have grasped that even at the stage that the resist film R comes into contact with the developing solution that is the initial stage of development, a dissolved material 61 elutes from a surface layer R1 of an exposed region 60 of the resist film R and the dissolved material 61 adheres to the surface of the wafer W, for example, as illustrated in FIG. 10, resulting in a reduction in the contact angle of the developing solution D with respect to the surface of the wafer W. Note that since the contact period between the developing solution D and the exposed region 60 is short at the initial stage of development, only the surface layer of the resist film R is dissolved with the developing solution D. If the rotation direction of the wafer W when the developing solution D is supplied to the central portion of the wafer W is kept in only one direction, the developing solution D unevenly adheres to the surface of the wafer W, for example, as illustrated in FIG. 10. In other words, a force in one direction acts on the dissolved material 61 by the acceleration when the wafer W starts to rotate, to cause the dissolved material 61 to flow out, for example, from a patterned part that is the exposed region 60 of the resist film R to a non-patterned part that is unexposed region 62. However, the dissolved material 61 has strong adhesion to the unexposed region 62 so that the dissolved material 61 once adhered to the unexposed region 62 keeps adhering to the unexposed region 62 as it is. In particular, the adhesion of the dissolved material 61 is grate as compared to the centrifugal force when the wafer W is rotated, so that the unevenness of adherence of the dissolved material 61 is not eliminated even by rotating the wafer W.

Figure 11:
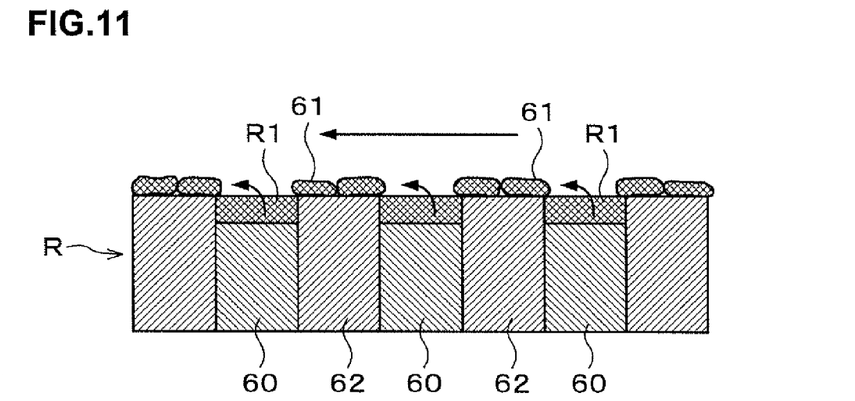
FIG. 11 is an explanatory view schematically illustrating the appearance that a dissolved material of resist dissolved with the developing solution elutes from the resist film.

As described above, the dissolved material 61 and the resist film R are different in contact angle with respect to the developing solution D, so that if the adherence of the dissolved material 61 becomes uneven, the contact angle will vary within the wafer W. For this reason, the rotation direction of the wafer W is reversed as has been described to cause the force in the reverse direction to act on the dissolved material 61 so as to ensure that the dissolved material 61 flowing out from the exposed region 60 adheres also to the side of the unexposed region 62 to which the dissolved material 61 has not adhered, for example, as illustrated in FIG. 11. This lessens or eliminates the unevenness of adherence of the dissolved material 61 to reduce the contact angle over the entire surface of the wafer W. Note that the dissolved material 61 does not elute any longer after the initial stage of development, concretely, a lapse of seven seconds from the time when the dissolved material 61 comes into contact with the developing solution D, and therefore it is necessary to switch the rotation direction of the wafer W within this period.

Figure 12:
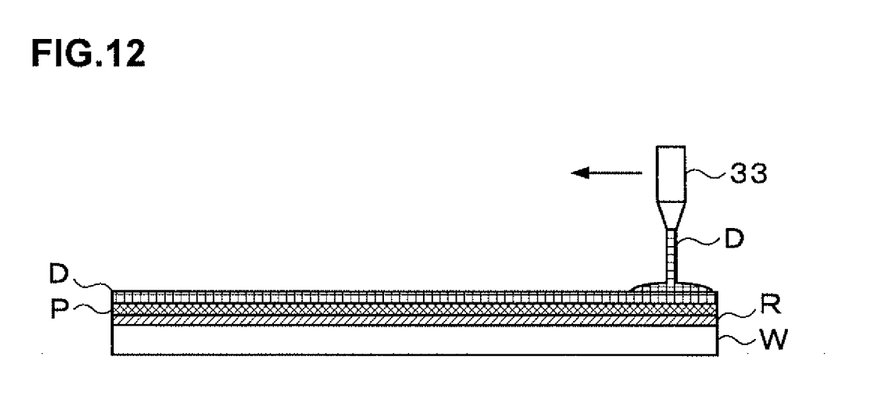
FIG. 12 is an explanatory view schematically illustrating the appearance that the developing solution is supplied to the edge portion of the wafer.

Next, the developing treatment performed subsequent to the pre-wet treatment will be described. First of all, the developing solution nozzle 33 is moved from a position corresponding to the central portion of the wafer W for which the pre-wet treatment has been performed to a position above the edge portion of the wafer W (Step S8 in FIG. 4). Then, the wafer W is rotated, for example, at a rotation number of 500 rpm and the developing solution D is supplied from the developing solution nozzle 33 as illustrated in FIG. 12 (Step S9 in FIG. 4). Thereafter, the developing solution nozzle 33 is moved from the position above the edge portion of the wafer W to the position corresponding to the central portion of the wafer W while the supply of the developing solution D from the developing solution nozzle 33 is continued (Step S10 in FIG. 4). In other words, the supply point of the developing solution D is moved from the edge portion of the wafer W to the central portion of the wafer W. The period required for moving the developing solution nozzle 33 from the position above the edge portion of the wafer W to the position corresponding to the central portion of the wafer W is, for example, about two seconds. This movement supplies the developing solution D in a spiral form on the surface of the wafer W, whereby the developing solution D can be applied without gap on the surface of the wafer W. In this event, since the surface of the wafer W is small in contact angle with respect to the developing solution D, namely, high in wettability, the developing solution D evenly spreads over the entire surface of the wafer W to perform stable developing treatment.

Figure 13:
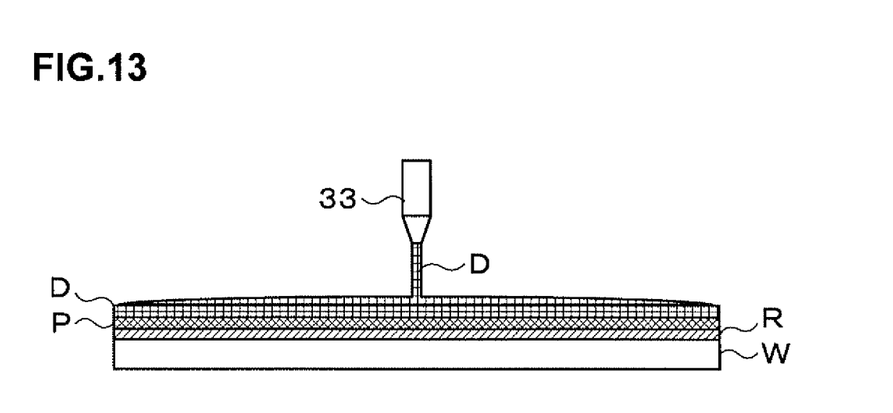
FIG. 13 is an explanatory view schematically illustrating the appearance that the developing solution is supplied to the central portion of the wafer.

Thereafter, the developing solution nozzle 33 supplies the developing solution D for a predetermined period, for example, five seconds above the central portion of the wafer W as illustrated in FIG. 13, and stops the discharge operation and retracts to the waiting section 35 (Step S11 in FIG. 4). Note that after the stop of the supply of the developing solution D from the developing solution nozzle 33, the rotation of the wafer W may be stopped, for example, for 45 seconds for stand development.

In parallel with the retraction of the developing solution nozzle 33, the pure water nozzle 40 is moved to the position above the central portion of the wafer W. Then, pure water is supplied from the pure water nozzle 40 to the central portion of the wafer W to clean the surface of the wafer W (Step S12 in FIG. 4). The rotation number of the wafer W in this event is, for example, 500 rpm, and the pure water P supplied from the pure water nozzle 40 is spread from the center toward the edge of the wafer W to wash away the developing solution D. This causes the pH on the surface of the wafer W to approach 7 so that the dissolved material 61 is eluted from the exposed region 60 and washed away with the pure water P. Thereafter, the supply of the pure water P is stopped and the pure water nozzle 40 is retracted to the waiting section 42, and the wafer W is rotated, for example, at a rotation number of 2000 rpm for a predetermined period and thereby subjected to spin dry (Step S13 in FIG. 4). The wafer W is then transferred by the transfer mechanism (not illustrated) out of the developing treatment apparatus 1, with which a series of the developing treatment ends.

According to the above embodiment, since the pure water P as the surface treatment liquid is first supplied to one location of the peripheral portion of the wafer W, the liquid puddle Pa is formed at a position where the supplied pure water P lands on the wafer W, and the small air bubbles A occur between the liquid puddle Pa and the wafer W. By moving the pure water nozzle 40 to the position above the central portion of the wafer W while continuing the supply of the pure water P, the liquid puddle Pa formed at the peripheral portion of the wafer W is moved to the central portion of the wafer, so that the air bubbles A existing between the wafer W and the pure water P disappear accompanying the movement of the pure water P. Accordingly, the air bubbles A occurring between the wafer W and the pure water P when the pure water P is supplied onto the wafer W never inhibit the contact between the resist film R and the developing solution D in the step of the developing treatment. Therefore, defects on the surface of the substrate can be reduced.

Further, performing the pre-wet treatment improves the wettability between the wafer W and the developing solution D, resulting in a reduction of liquid bounce of the developing solution D from the wafer W when the developing solution D is supplied to the wafer W. This can prevent contamination of the developing treatment apparatus 1. Further, the developing solution D becomes more likely to spread, so that the amount of the developing solution D used can be reduced. Furthermore, it becomes easier to accumulate the developing solution D on the surface of the wafer W and, in this event, the solution accumulation can be made with a small amount of developing solution.

Though the pure water P is supplied to the peripheral portion of the wafer W with the rotation of the wafer W being stopped in the above embodiment, the pure water P may be supplied with the wafer W being rotated at a rotation number at which the pure water P supplied to the wafer W forms the liquid puddle Pa, for example, 10 rpm.

According to the above embodiment, since the rotation direction of the wafer W is reversed while the developing solution D is being supplied to the central portion of the wafer W after the liquid puddle Pa of the pure water P is moved to the central portion of the wafer W, the dissolved material 61 eluted from the exposed region 60 adheres to the unexposed region 62 without unevenness, so that the contact angle of the developing solution D is reduced over the entire surface of the wafer W. This makes the developing solution D supplied to the wafer W during the development easily spread over the entire surface of the wafer W. As a result, the developing treatment can be performed on the entire surface of the wafer W with high evenness even if the resist film R formed on the wafer W has high water repellency, resulting in a reduction of development defects such as poor resolution.

In the above embodiment, the liquid puddle Pa is formed at the central portion of the wafer W by moving the liquid puddle Pa of the pure water P formed at the peripheral portion of the wafer W to the central portion of the wafer W and then stopping the supply of the pure water P. The forming of the liquid puddle Pa at the central portion does not strictly mean the forming of the liquid puddle Pa only at the central portion of the wafer W but also includes the case that the liquid puddle Pa is formed on the entire surface of the wafer W, for example, by continuing the supply of the pure water P after the liquid puddle Pa is moved to the central portion of the wafer W. In other words, it is only necessary that the liquid puddle Pa is formed at least at the central portion of the wafer W.

Though the wafer W is reversely rotated in Step S7 of performing the pre-wet treatment in the above embodiment, the present invention is not limited to this, but when supplying the developing solution D in Step S7, the wafer W may be rotated in the same rotation direction as the rotation direction in Step S6 to cause the developing solution D to spread toward the edge portion of the wafer W.

Though the wafer W is rotated to cause the developing solution D to spread over the entire surface of the wafer W in the developing treatment after the pre-wet treatment in the above embodiment, the developing solution may be applied onto the wafer by using a long developing solution nozzle having a discharge port that is the same as or longer than the diameter of the wafer W and moving the developing solution nozzle from a position above one end of the wafer W toward a position above the other end while supplying the developing solution D. If the developing solution is supplied using the long developing solution nozzle to the resist film with high water repellency, the developing solution is likely to spatter to the surroundings because of the large contact angle between the wafer and the developing solution and the spattered developing solution causes secondary pollution. Therefore, the long developing solution nozzle has not conventionally been used when supplying the developing solution to the resist film with high water repellency. In this regard, according to the present embodiment, the wettability between the developing solution and the wafer W is improved by performing the pre-wet treatment, so that it is possible to use the long developing solution nozzle which has not conventionally been used.

Figure 14:
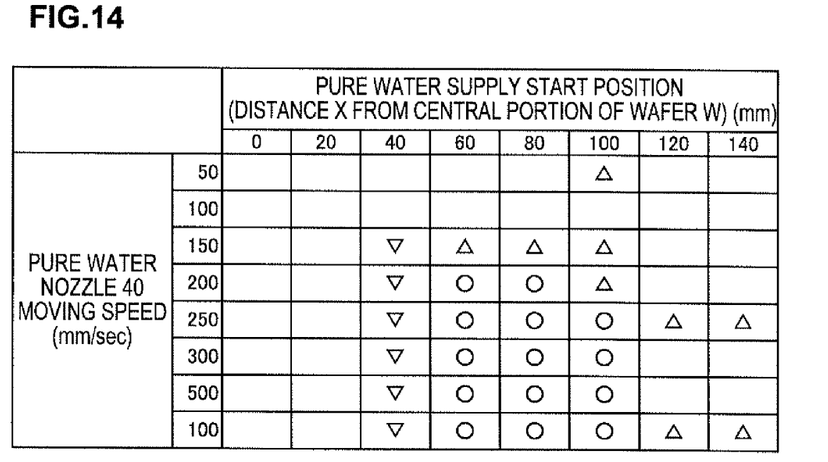
FIG. 14 is a table indicating the relation between the moving speed of the pure water nozzle, the start position of supply of the pure water and the state of the liquid puddle.

For performing the developing treatment method of the present invention as an example, a test of changing the moving speed when moving the pure water nozzle 40 while supplying the pure water P in a range of 50 mm/sec to 1000 mm/sec and changing the distance X between the position where the pure water nozzle 40 started the supply of the pure water P at the peripheral portion of the wafer W and the central portion of the wafer W in a range of 40 mm to 140 mm, and checking the state of the liquid puddle Pa after moved to the central portion of the wafer W was carried out. Note that the diameter of the wafer W used for the test is 300 mm and the supply amount of the pure water P from the pure water nozzle 40 is 400 ml/min. The test result is illustrated in FIG. 14. In FIG. 14, the case that when the pure water nozzle 40 was moved, the liquid puddle Pa was moved to the central portion of the wafer W without tearing or becoming elliptical is evaluated as good and indicated by "○". Besides, the case that the liquid puddle Pa became elliptical or turned into a torn state is indicated by "Δ", and the case that the liquid puddle Pa did not become elliptical or turn into a torn state but the liquid puddle Pa formed at the peripheral portion of the wafer W and the liquid puddle Pa moved to the central portion of the wafer W interfered with each other is indicated by "∇".

As illustrated in FIG. 14, when the position where the pure water nozzle 40 starts the supply of the pure water P is the position located 40 mm from the central portion of the wafer W, the liquid puddle Pa formed at the peripheral portion of the wafer W and the liquid puddle Pa moved to the central portion of the wafer W interfere with each other irrespective of the moving speed of the pure water nozzle 40. This is because the position where the position where the supply of the pure water P is started is too close to the central portion of the wafer W. In this case, in the area where the liquid puddles Pa interfere with each other, the air bubbles A are not exposed to the outside but stay therein, and the air bubbles A in the area cannot be removed even by moving the liquid puddles Pa, so that the remaining air bubbles A cause development defects. Therefore, the position where the pure water nozzle 40 starts the supply of the pure water P at the peripheral portion of the wafer W is preferably the position located 60 mm or more from the central portion of the wafer W.

On the other hand, it was confirmed that when the supply of the pure water P was started at the position located more than 100 mm from the central portion of the wafer W, the shape of the liquid puddle Pa after moved to the central portion of the wafer W became elliptical or the liquid puddle Pa turned into a torn state. If the liquid puddle Pa becomes elliptical or turns into a torn state, the liquid puddle Pa can be left in the area where the liquid puddle Pa was formed at the peripheral portion of the wafer W even by moving the liquid puddle Pa to the central portion of the wafer W and, also in this case, the air bubbles A remain in the area. Therefore, to remove all of the air bubbles A from the wafer W, the position where the pure water nozzle 40 starts the supply of the pure water P at the peripheral portion of the wafer W is preferably the position located 60 mm to 100 mm from the center of the wafer W.

Next, it was confirmed that when the moving speed of the pure water nozzle 40 was, for example, 150 mm/sec or lower, the shape of the liquid puddle Pa after moved to the central portion of the wafer W became elliptical even when the start position of the supply of the pure water P from the pure water nozzle 40 was the position located 60 mm to 100 mm from the central portion of the wafer W. This seems because the moving speed of the pure water nozzle 40 is low and therefore the force for accelerating the liquid puddle Pa formed at the peripheral portion of the wafer W toward the central portion of the wafer W by the surface tension of the pure water P is too weak to completely move the liquid puddle Pa to the central portion of the wafer W. Accordingly, the moving speed of the pure water nozzle 40 is preferably set to 200 mm/sec to 1000 mm/sec. Note that, as illustrated in FIG. 14, when the moving speed is 200 mm/sec, the position where the supply of the pure water P is started is preferably the position located 60 to 80 mm from the center of the wafer W.

Accordingly, from the above result, it was confirmed that it is possible to move the liquid puddle Pa in a good condition to the central portion of the wafer W to thereby preferably remove the air bubbles A from the top of the wafer W when the position where the pure water nozzle 40 starts the supply of the pure water P at the peripheral portion of the wafer W is a position at a distance X from the central portion of the wafer W ranging 60 mm to 100 mm when the moving speed of the pure water nozzle 40 is set to a range from 250 mm/sec to 1000 mm/sec, and when the position where the pure water nozzle 40 starts the supply of the pure water P at the peripheral portion of the wafer W is a position at a distance X from the central portion of the wafer W ranging 60 mm to 80 mm when the moving speed of the pure water nozzle 40 is set to a range from 200 mm/sec to less than 250 mm/sec.

Figure 15:
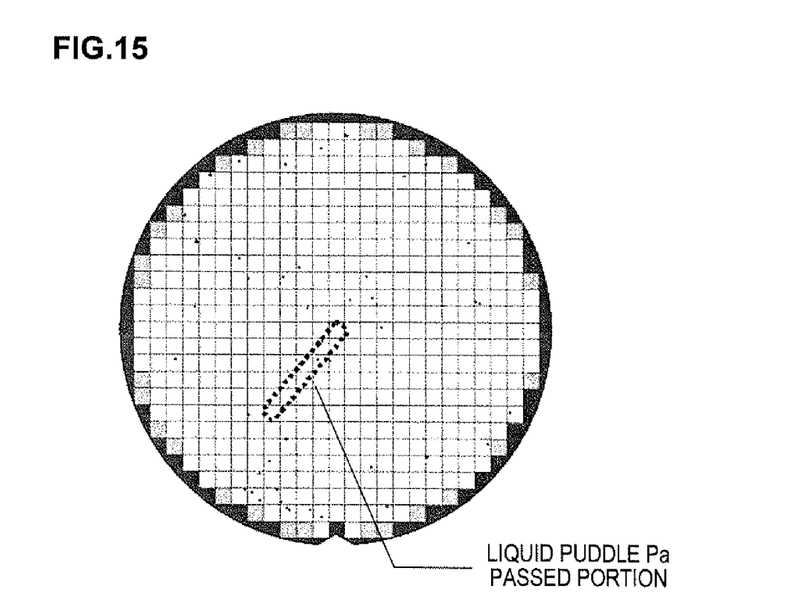
FIG. 15 is an explanatory view illustrating the state of the surface of the wafer for which development has been performed using a developing treatment method according to this embodiment.

Note that as a result of performing the supply of the pure water P under the conditions of "○" in FIG. 14 for performing the developing treatment, it was confirmed that there was no development defect at the central portion as illustrated in FIG. 15 though development defects were confirmed at the central portion of the wafer W in FIG. 16. Further, it was also confirmed that no development defect occurred even at a position of the wafer W corresponding to the trajectory of the movement of the pure water nozzle 40, in other words, a portion on the wafer W where the liquid puddle Pa passed along.

A Preferred embodiment of the present invention has been described above with reference to the accompanying drawings, but the present invention is not limited to the embodiment. It should be understood that various changes and modifications are readily apparent to those skilled in the art within the scope of the spirit as set forth in claims, and those should also be covered by the technical scope of the present invention. The present invention is not limited to this embodiment but can take various forms. The present invention is also applicable, for example, to the case that a cleaning chemical such as pure water or an ammonia solution or another treatment solution such as an etching solution is supplied to the substrate on which a film having a hydrophobized surface is formed. Besides, while the above-described embodiment is an example of performing developing treatment on the wafer, the present invention is also applicable to the case that the substrate is another substrate such as an FPD (Flat Panel Display), a mask reticle for a photomask other than the wafer.

The present invention is useful for developing the resist film formed on a substrate such as, for example, a semiconductor wafer.

What is claimed is:

1. A substrate treatment method of supplying a surface treatment liquid onto a surface of a substrate having a film with high water repellency formed thereon, said method comprising:
   a liquid puddle forming step of forming a liquid puddle of the surface treatment liquid by supplying the surface treatment liquid from a nozzle to one location of a peripheral portion of the substrate; and
   a liquid puddle moving step of then moving the liquid puddle formed at the peripheral portion of the substrate to a central portion of the substrate by moving the nozzle from a position above the peripheral portion of the substrate to a position above the central portion of the substrate while continuing the supply of the surface treatment liquid.

2. The substrate treatment method as set forth in claim 1, wherein a position where the surface treatment liquid is supplied in said liquid puddle forming step is a position where the liquid puddle of the surface treatment liquid formed in said liquid puddle forming step does not interfere, in a plan view, with the liquid puddle of the surface treatment liquid moved to the central portion in said liquid puddle moving step.

3. The substrate treatment method as set forth in claim 2, wherein the position where the surface treatment liquid is supplied in said liquid puddle forming step is
   a position at a distance from the central portion of the substrate ranging from 60 mm to 100 mm when a moving speed of the nozzle ranges from 250 mm/sec to 1000 mm/sec, and
   a position at a distance from the central portion of the substrate ranging from 60 mm to 80 mm when the moving speed of the nozzle ranges from 200 mm/sec to less than 250 mm/sec.

4. The substrate treatment method as set forth in claim 3, wherein the surface treatment liquid is pure water.

5. The substrate treatment method as set forth in claim 2, wherein the surface treatment liquid is pure water.

6. The substrate treatment method as set forth in claim 1, wherein the surface treatment liquid is pure water.

7. A non-transitory computer-readable storage medium storing a program running on a computer of a control unit controlling a substrate treatment apparatus to cause the substrate treatment apparatus to execute a substrate treatment method of supplying a surface treatment liquid onto a surface of a substrate having a film with high water repellency formed thereon,
   said substrate treatment method, comprising:
   a liquid puddle forming step of forming a liquid puddle of the surface treatment liquid by supplying the surface treatment liquid from a nozzle to one location of a peripheral portion of the substrate; and
   a liquid puddle moving step of then moving the liquid puddle formed at the peripheral portion of the substrate to a central portion of the substrate by moving the nozzle from a position above the peripheral portion of the substrate to a position above the central portion of the substrate while continuing the supply of the surface treatment liquid.

8. A substrate treatment apparatus for supplying a surface treatment liquid onto a surface of a substrate having a film with high water repellency formed thereon, said apparatus comprising:
   a nozzle supplying the surface treatment liquid onto the substrate;
   a nozzle moving mechanism moving said nozzle; and
   a control unit controlling operations of said nozzle and said nozzle moving mechanism,
   wherein said control unit controls said nozzle and said nozzle moving mechanism to form a liquid puddle of the surface treatment liquid by supplying the surface treatment liquid from said nozzle to one location of a peripheral portion of the substrate and then move the liquid puddle formed at the peripheral portion of the substrate to a central portion of the substrate by moving said nozzle from a position above the peripheral portion of the substrate to a position above the central portion of the substrate while continuing the supply of the surface treatment liquid.

9. The substrate treatment apparatus as set forth in claim 8, wherein said control unit controls said nozzle and said nozzle moving mechanism such that when said nozzle supplies the surface treatment liquid to the peripheral portion of the substrate, the liquid puddle of the surface treatment liquid formed by the supply of the surface treatment liquid from said nozzle to the peripheral portion of the substrate is located not to interfere, in a plan view, with the liquid puddle of the surface treatment liquid moved to the central portion of the substrate when a position of said nozzle is moved to the position above the central portion of the substrate.

10. The substrate treatment apparatus as set forth in claim 9,
    wherein the position where the surface treatment liquid is supplied at the peripheral portion of the substrate is
    a position at a distance from the central portion of the substrate ranging from 60 mm to 100 mm when a moving speed of said nozzle ranges from 250 mm/sec to 1000 mm/sec, and
    a position at a distance from the central portion of the substrate ranging from 60 mm to 80 mm when the moving speed of said nozzle ranges from 200 mm/sec to less than 250 mm/sec.

11. The substrate treatment apparatus as set forth in claim 10,
    wherein the surface treatment liquid is pure water.

12. The substrate treatment apparatus as set forth in claim 9,
    wherein the surface treatment liquid is pure water.

13. The substrate treatment apparatus as set forth in claim 8,
    wherein the surface treatment liquid is pure water.

* * * * *